United States Patent
Nagahata et al.

[11] Patent Number: 5,874,983
[45] Date of Patent: Feb. 23, 1999

[54] THERMAL PRINT HEAD

[75] Inventors: Takaya Nagahata; Tadayoshi Sato, both of Kyoto, Japan

[73] Assignee: Rohm Co., Ltd., Kyoto, Japan

[21] Appl. No.: 983,438

[22] PCT Filed: Aug. 6, 1996

[86] PCT No.: PCT/JP96/02216

§ 371 Date: Jan. 7, 1998

§ 102(e) Date: Jan. 7, 1998

[87] PCT Pub. No.: WO97/06011

PCT Pub. Date: Feb. 20, 1997

[30] Foreign Application Priority Data

Aug. 9, 1995 [JP] Japan ..................................... 7-203253
Aug. 9, 1995 [JP] Japan ..................................... 7-203254

[51] Int. Cl.⁶ .............................. B41J 2/345; B41J 2/335; B41J 2/34
[52] U.S. Cl. ............................................ 347/200; 347/205
[58] Field of Search ..................................... 347/200, 201, 347/205, 208, 209

[56] References Cited

FOREIGN PATENT DOCUMENTS

| | | |
|---|---|---|
| 58-188674 | 11/1983 | Japan . |
| 60-127933 | 8/1985 | Japan . |
| 1-165242 | 11/1989 | Japan . |
| 2-286261 | 11/1990 | Japan . |
| 3-57656 | 3/1991 | Japan . |
| 5-208513 | 8/1993 | Japan . |
| 5-60848 | 8/1993 | Japan . |
| 07201384 | 8/1995 | Japan . |

*Primary Examiner*—Huan H. Tran
*Attorney, Agent, or Firm*—Fish & Richardson P.C.

[57] ABSTRACT

The printing cost is minimized by reducing the number of parts of a thermal print head used for printers, for such as a facsimile, and the quality of a printed product is improved by preventing the warpage of the thermal print head. A base plate mounting surface of a heat radiation plate (2) is provided with a longitudinally extending mounting surface dividing groove (5). A head base plate (3) having a heating resister (6) for printing and a circuit board (4) having a connector (10) for external connection are fixed on the base plate mounting surface. The two plates (3, 4) are arranged so as to be opposed to each other with the mounting surface dividing groove positioned therebetween. Terminal electrodes (8, 11) provided on groove-side edge portions of the head base plate and circuit board are connected together by a terminal lead (9). An edge portion of at least one of the head base plate and circuit board projects to a position above the mounting surface dividing groove and forms a projecting edge portion, which is held from the upper and lower sides thereof by one end portion (9a, 9b) of the terminal lead.

7 Claims, 11 Drawing Sheets

PRIOR ART

THERMAL PRINT HEAD

BACKGROUND OF THE INVENTION

1. Field of the Invention

The present invention relates to a thermal print head which is used in printers, facsimile machines, or the like. More specifically, it relates to a thermal print head comprising two substrates which are installed on a heat radiating metal plate. One substrate is a head substrate of heat resistant insulating material, such as a ceramic, having a heating resistor for printing. The other is a circuit substrate of synthetic resin having a connector to external devices.

2. Description of the Related Art

Heretofore, a type of thermal print head in which a head substrate and a circuit substrate are installed on the surface of a heat radiating metal plate has been widely used. An example such a of the conventional thermal print head is shown in the Official Gazette of Japanese Patent Laid-Open Publication No. Hei 2-286261.

In such an apparatus, the head substrate is made of a heat resistant insulating material, and a heating resistor for printing is formed on the surface of the head substrate. For the purpose of supplying electric current to the heating resistor, a common wiring pattern, an individual wiring pattern, and a plurality of circuit drive elements are also provided on the surface of the head substrate. Further, on the surface of the head substrate, various types of terminal electrodes (hereinafter referred to as head side terminals) are formed for connecting with the circuit substrate.

On the other hand, the circuit substrate, which is made of synthetic resin, has a connector to external devices. On the surface of the circuit substrate, a wiring pattern is provided for connecting the connector with the head side terminals.

Figure 19:
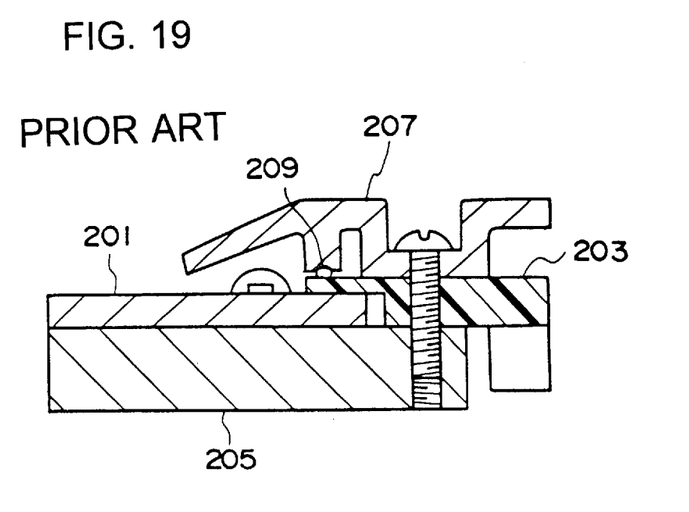
FIG. 19 is a cross-sectional view illustrating a conventional thermal print head.

FIG. 19 in this specification is a cross-sectional view of such a thermal print head. A head substrate 201 and a circuit substrate 203 are arranged side by side on a heat radiating plate 205. Both of the substrates are arranged in such a manner that an end of the circuit substrate 203 overlaps with head side terminals of the head substrate 201. A presser 207 is screwed to the heat radiating plate 205. The circuit substrate 203 is pressed down by the presser 207 through elastic thread 209. Due to the press, the wiring pattern on the side of the circuit substrate 203 is electrically connected with the head side terminals. More specifically, the presser 207 has a function of making continuity between both of the substrates by pressing the circuit substrate. Further, the presser 207 has a function of protecting both of the substrates.

The structure described above has an advantage of being inexpensive because the area of the head substrate can be made small. The structure also has an advantage of being able to service general purposes. In other words, if the circuit substrate is modified, the structure would be applicable to various types of external devices.

However, conventional thermal print heads had the following problems:

(1) In order to electrically connect the head substrate with the circuit substrate, it is required to have a presser and a plurality of set screws and elastic threads for installing the presser in the aforementioned structure. Therefore, a large number of parts and processing steps are required, whereby it has the disadvantages of being expensive and heavy.

(2) In order to secure the electrical connection of the head substrate and the circuit substrate, the clamping strength of the presser on the heat radiating plate must be enhanced. For this reason, the presser has high rigidity and is screwed at several points in a longitudinal direction.

When the temperature rises under such a condition that the head substrate and the circuit substrate are being pressed by a high degree of clamping strength, the head substrate may warp resulting from the differential thermal expansion of the head substrate and the circuit substrate. Also, due to such a high clamping strength, distortion may arise at the heat radiating plate in a longitudinal direction. Further, as the heat radiating plate and the presser are fixed to each other, distortion may arise due to the differential thermal expansion of the heat radiating plate and the presser. For the reasons described above, nonuniformity in printing may arise which may deteriorate printing quality.

(3) The presser is installed on each upper side of the head substrate and the circuit substrate. In order to prevent the contact of the presser and printing paper, the presser is arranged away from the head substrate's heating resistor for printing. For the reasons described above, the height and width (width in a direction of a right angle to a longitudinal direction) of the thermal print head increase, and the thermal print head resultingly becomes larger and heavier.

OTHER RELATED ART

On the other hand, in a thermal print head shown in the Official Gazette of Japanese Patent Laid-Open Publication No.

Hei 3-57656, a heat radiating plate has upper and lower stepped flat surfaces. A head substrate is installed on the upper surface, whereas a circuit substrate is installed on the lower surface. Thus, it is proposed that the circuit substrate be installed one step lower than the head substrate. However, in this case, the thickness of a heat radiating plate must be increased as will be explained hereunder.

The thermal print head in a facsimile machine or the like may be installed on the upper surface of a member of the framework while the lower surface of the heat radiating plate closely touches the member of the framework. A plurality of fitting screws are inserted from the lower surface of the member of the framework, and these screws are thread into each tapped hole of the heat radiating plate, respectively. Therefore, it is necessary to secure a heat radiating plate of a prescribed thickness which is sufficient for screwing. The prescribed thickness means a thickness which permits a proper engagement of fitting male screws and the mating female screws over not less than a prescribed number of screw threads.

As is shown in the Official Gazette of Japanese Patent Laid-Open Publication No. Hei 3-57656, if the heat radiating plate has stepped flat surfaces, it will be necessary to secure the aforementioned prescribed thickness in an area of the lower surface. Therefore, in an area of the upper surface, the heat radiating plate has an unnecessary thickness. This leads to an increase in the material cost and weight of the heat radiating plate.

SUMMARY OF THE INVENTION

The present invention is directed to provide a thermal print head which can solve the technical problems described above. More specifically, a structure for connecting a head substrate and a circuit substrate has to be simplified and a tight fastening of these two substrates is not required. The object of the present invention is to decrease the cost and weight by providing such a thermal print head and to improve printing quality by preventing a warp of the head substrate.

In order to achieve the above object, a thermal print head according to the present invention comprises:

a head substrate having a heating resistor for printing and circuit drive elements; a circuit substrate having a connector to external devices and being electrically connected with said head substrate, wherein said head substrate and said circuit substrate are installed side by side on a heat radiating metallic plate; said heat radiating plate has an installation area parting groove being extended in a longitudinal direction on a surface where said substrates are installed; said head substrate and said circuit substrate are arranged on said surface so that they lie on opposite sides of said groove; and a terminal electrode provided at an edge on the groove side of said head substrate and a terminal electrode provided at an edge on the groove side of said circuit substrate are connected to each other by means of a terminal lead.

In a preferable embodiment of the present invention, at least one edge of the head substrate and the circuit substrate projects over the parting groove to form a projected edge, and the terminal lead has a holding section which holds the projected edge in between the upper and lower sides of the holding section. The terminal lead is fitted to the projected edge by means of the holding section. Further, it is preferable that the terminal lead is made of a metallic material having an elasticity which facilitates holding of the projected edge.

As a concrete example, a case in which an edge on the groove side of the head substrate projects over the installation area parting groove will be subsequently described. In this case, either a portion or the full length of the head substrate may project over the parting groove. The holding section of the terminal lead is fitted to the projected edge of the head substrate. Installation of the terminal lead at a part to which the terminal electrode is provided, it eases connection of an end of the terminal lead to the terminal electrode. The other end of the terminal lead is connected with the terminal electrode on the side of the circuit substrate. This is also the case when an edge on the groove side of the circuit substrate projects over the parting groove of the heat radiating plate.

Also, each edge on the groove side of both substrates may project over the parting groove of the heat radiating plate. In this case, it is possible to have constitution in which a holding section is provided at an end of the terminal lead and the holding section is fitted to either of these substrates. A constitution in which a holding section is provided at every both ends or the terminal lead is also preferable.

In the present invention, the terminal electrode provided at an edge on the groove side of the head substrate is connected with the terminal electrode provided at an edge on the groove side of the circuit substrate by means of the terminal lead. It is not necessary for the head substrate and the circuit substrate to press against to each other. Therefore, the presser heretofore in use can be omitted, thereby reducing the number of parts and processing steps. Thus, it is possible to decrease the cost and weight.

Further, in the present invention, the terminal lead deflects due to the different thermal expansions of the head substrate and the circuit substrate. Therefore, cases of a large force resulting from differential thermal expansion being applied between the substrates will not occur, which can reduce the occurrence of warp in the head substrate. Further, warp in each part resulting from mutual tightening force between the parts can be reduced. Reduction of these warps can lead to improved print quality.

As described above, the heat radiating plate will be thick if it is provided with differences in level. In the present invention, however, differences in level are not required for the heat radiating plate. Moreover, in the present invention, the presser can be omitted. Therefore, the height and width of the thermal print head can be reduced, making it possible to miniaturize and lighten the thermal print head. Also, due to reduction in materials, production costs are reduced.

In the present invention, the terminal lead is fixed to a part (projected edge) which is an edge of the head substrate or the circuit substrate and projects over the parting groove provided on the heat radiating plate. Therefore, the terminal lead can be securely and firmly fixed to the projected edge by utilizing both sides of either substrate.

Because a groove is provided on the upper surface of the heat radiating plate, the surface area of the heat radiating plate becomes larger. Therefore, radiation of heat to the atmosphere can be accelerated, thereby improving high speed printing performance.

In an embodiment of the present invention, an insulating protection sheet is provided on the upper surfaces of the head substrate and the circuit substrate, except for at least an area where the heating resistor is installed. As described above, in the present invention, the head substrate and the circuit substrate are arranged on almost the same plane. Therefore, it is possible to improve the resistance to static electricity of the circuit drive elements and the circuit substrate by taking such a simple measure such as providing the protection sheet on that plane.

Also, in an embodiment of the present invention, a cover plate is installed in a manner such that it covers both the upper surface of the circuit substrate and an area of the upper surface of the head substrate on which the circuit drive elements are installed. The protection sheet described above may not by itself be able to fully protect the head substrate and the circuit substrate. However, by providing a cover plate, the head substrate and the circuit substrate are protected in a preferable manner. Further, it is not necessary to firmly fasten the cover plate as is required when a conventional type of presser is installed. Therefore, there will be no problems with head substrate warping.

In a preferable embodiment of the present invention, a convexity is provided on a back of the cover plate so that the cover plate can be arranged at a prescribed distance from the head substrate and the circuit substrate. In this constitution, the back of the cover plate does not directly touch the head substrate and the circuit substrate. Therefore, when the cover plate is installed, the circuit drive elements and the circuit substrate are not damaged. It is preferable to use a boss or a rib as the convexity.

It is also preferable to have a constitution in which a rib is fitted to the lower surface of the cover plate and this rib is extended along the side edge of the circuit substrate. Accurate positioning of the cover plate is automatically performed when the rib is fitted to the aforementioned side edge. Thus, it is possible to prevent the cover plate from being installed at an incorrect position. For example, contact of the cover plate with printing paper is prevented. Also, it is possible to install the cover plate in such a manner that the circuit drive elements of the head substrate and a wiring pattern of the circuit substrate are completely covered.

DESCRIPTION OF THE PREFERRED EMBODIMENTS

(1) Embodiment 1

Figure 1:
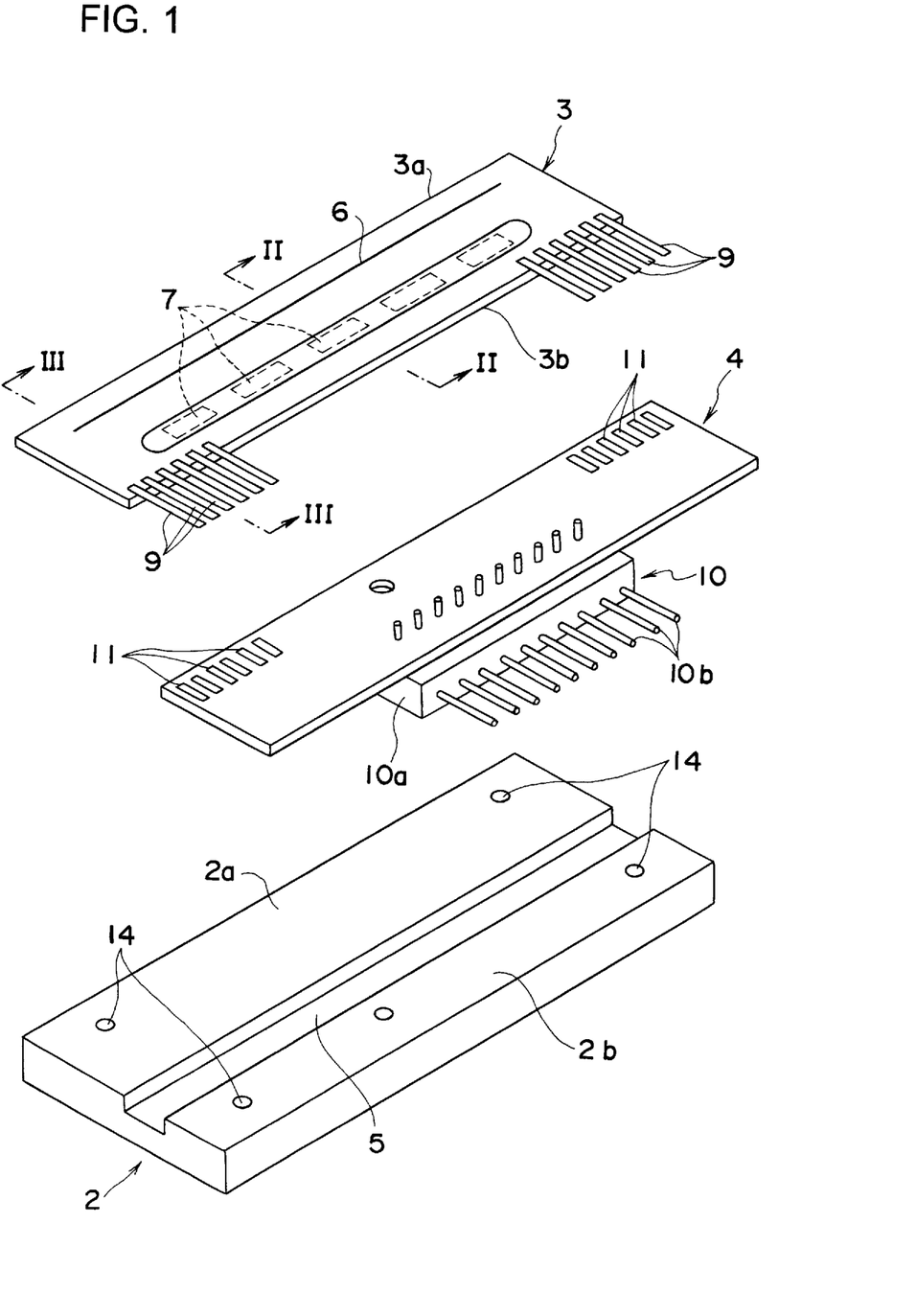
FIG. 1 is a cut-away view illustrating a thermal print head of Embodiment 1 of the present invention in a state of being disassembled.

A first embodiment of the present invention will be explained with reference to the attached drawings. In FIG. 1, a thermal print head is shown in a state of being disassembled. As shown in this drawing, the thermal print head 1 has a heat radiating plate 2, a head substrate 3, and a circuit substrate 4.

The heat radiating plate 2 made of a metallic material, such as an aluminum alloy, is provided in the shape of a slender rectangle. On the upper surface of the heat radiating plate 2, a longitudinally extending groove 5 is provided. The upper surface of the heat radiating plate 2 is partitioned by the groove 5 into a first installation area 2a and a second installation area 2b. Tapped holes 14 are provided at four corners of the heat radiating plate in order to fit the heat radiating plate 2 to the frame of a facsimile machine or the like.

Figure 2:
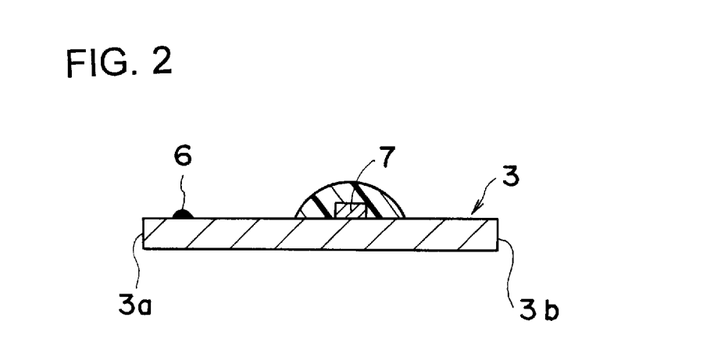
FIG. 2 is an enlarged view of the section II—II illustrating the thermal print head of FIG. 1.
Figure 3:
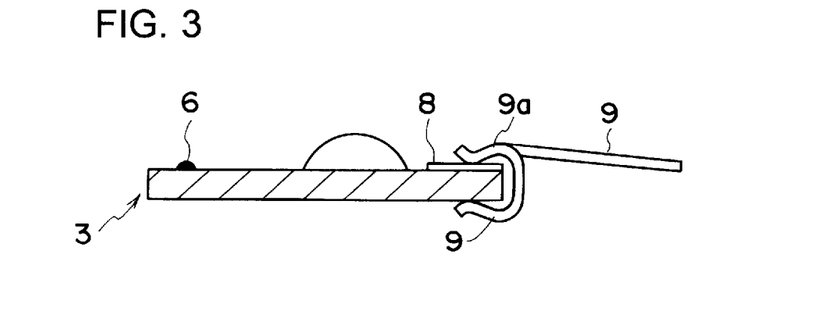
FIG. 3 is an enlarged view of the section III—III illustrating the thermal print head of FIG. 1.
Figure 4:
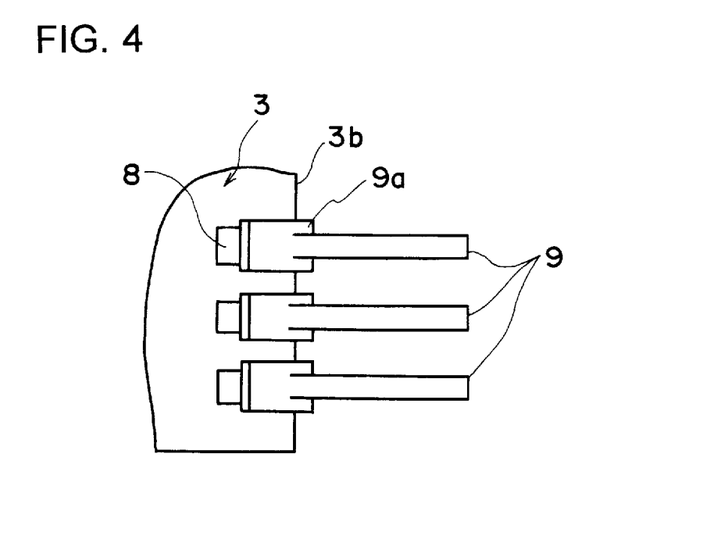
FIG. 4 is a top view of the part to which the terminal leads of FIG. 3 are fitted.
Figure 5:
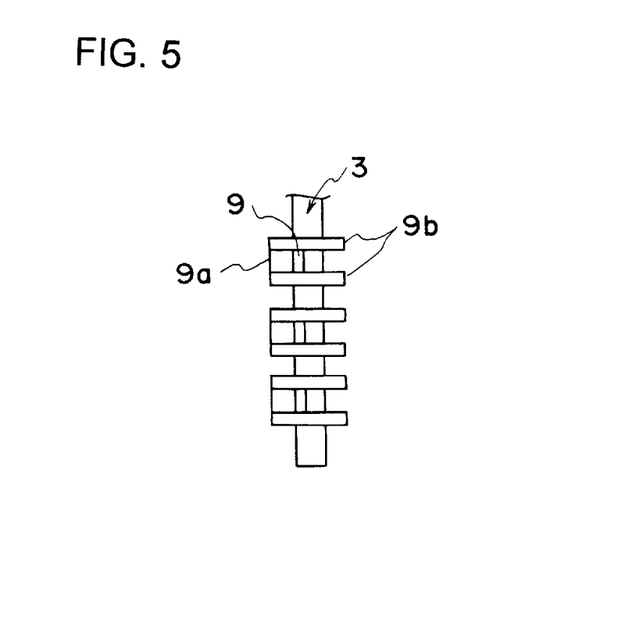
FIG. 5 is a right side view of the part to which one of the terminal leads of FIG. 3 is fitted.
Figure 6:
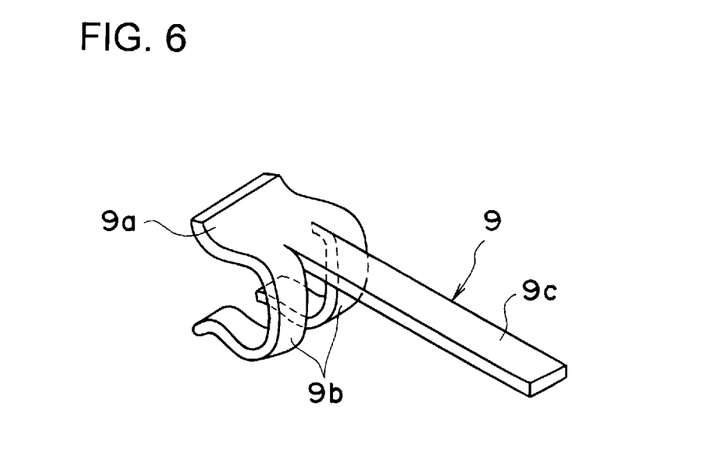
FIG. 6 is a cut-away view illustrating one of the terminal leads given in Embodiment 1 of the present invention.

The head substrate 3 is made of a heat resistant insulating material such as a ceramic. On the surface of the head substrate 3, a heating resistor for printing 6 is formed in such a manner that it extends in a straight line. The heating resistor 6 is formed along a longitudinal side edge 3a of the head substrate 3. Also, a plurality of circuit drive elements 7 are loaded in a line along the aforementioned heating resistor 6. These circuit drive elements 7 keep continuity with the heating resistors 6 at all printing dots via each individual wiring pattern. As shown in FIG. 2, these elements are protected by protective agents. The head substrate 3 is also provided with a common wiring pattern which is not shown in the drawings. The common wiring pattern keeps continuity with each printing dot of the heating resistor 6. Further, a plurality of head side terminals 8 are provided on the surface of the head substrate 3 along a longitudinal side edge 3b. The head side terminals 8 are terminal electrodes for connecting the circuit substrate 4 to each wiring of the head substrate 3. The head side terminals 8 are provided near both ends of the longitudinal edge 3b.

Each of the terminal leads 9 is fitted to all head side terminals 8. These terminal leads 9 are installed in a manner that they project in an approximate right angle from the longitudinal side edge 3b of the head substrate 3. Electrical continuity is made between the terminal leads 9 and the head side terminals 8, and the terminal leads 9 are stuck to the head substrate 3.

In FIGS. 3 to 6, constitution of the terminal leads 9 is shown in detail. The terminal leads 9 are elastic metal plates and also comprise a wide upper holding piece 9a and a pair of lower holding pieces 9b at one end. The lower holding pieces extend downward from the upper holding piece 9a. The space between the upper holding piece and the lower holding pieces is narrower than the thickness of the head substrate 3. By utilizing the elasticity, the upper holding piece 9a and the lower holding pieces 9b grasp the head substrate 3 from both sides. Thus, the terminal leads 9 are securely and firmly fitted to the head substrate 3. It is also possible to have constitution in which the upper holding piece 9a is soldered to the head side terminals 8.

Lead sections 9c of the terminal leads 9 extend diagonally to the level of the substrate as shown in the drawing. Therefore, the lead sections 9c are pushed to circuit side terminals 11 (described later) of the circuit substrate 4 by the elasticity described above.

Next, the circuit substrate 4 will be explained. The circuit substrate is made of a synthetic resin, such as a glass epoxy resin. A connector 10 is installed on an end of the circuit substrate 4. A connector body 10a of the connector 10 is provided with a plurality of terminal pins 10b. The terminal pins 10b are connected to wiring patterns (not shown in the drawings) formed on the surface of the circuit substrate 4. The circuit side terminals 11 are provided at edges on the other side of the circuit substrate 4 which is on the opposite side of the connector 10. The circuit side terminals 11 are terminal electrodes for making continuity between the aforementioned wiring patterns and the head side terminals 8.

Figure 7:
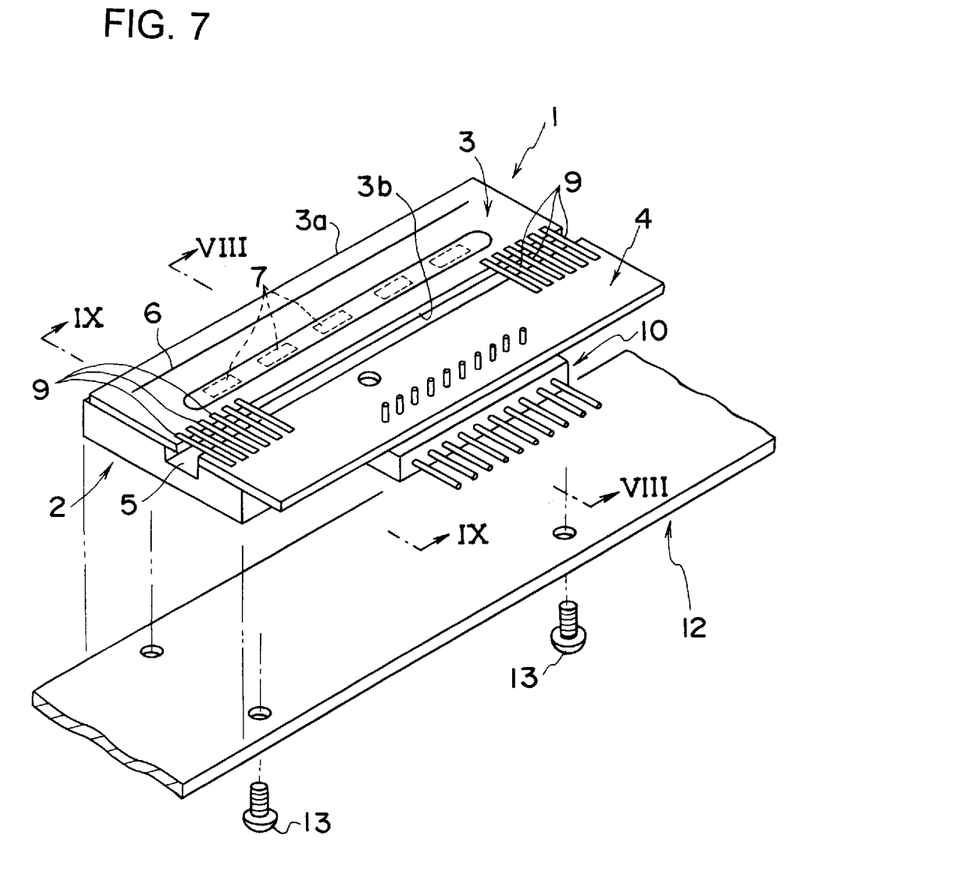
FIG. 7 is a cut-away view illustrating a thermal print head given in Embodiment 1 of the present invention.
Figure 8:
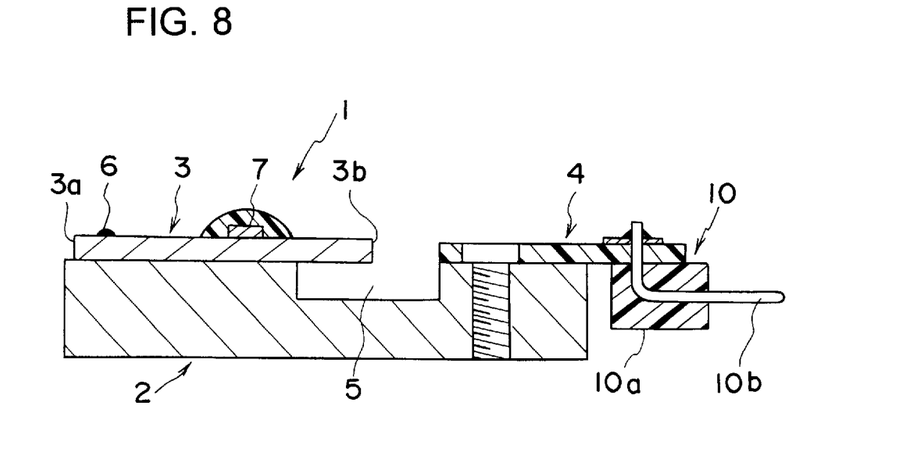
FIG. 8 is an enlarged view of the section VIII—VIII illustrating the thermal print head of FIG. 7.
Figure 9:
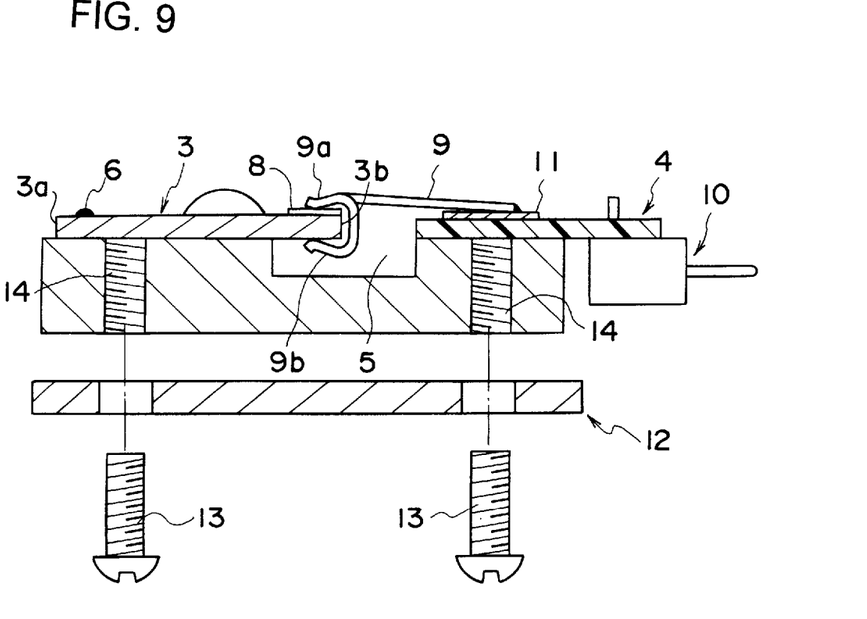
FIG. 9 is an enlarged view of the section IX—IX illustrating the thermal print head of FIG. 7.

FIGS. 7 and 8 show a state in which the head substrate 3 and the circuit substrate 4 are fitted to the heat radiating plate 2. The head substrate 3 is fixed by adhesives on the first installation area 2a of the heat radiating plate 2. The head substrate 3 is arranged in such a manner that the longitudinal side edge 3b (on the side which the terminal leads 9 are installed) projects over the groove 5. On the other hand, the circuit substrate 4 is fixed on the second installation area 2b of the heat radiating plate 2 using adhesives, and the circuit side terminals 11 are arranged on the side of the groove 5. Each of the terminal leads 9 is in contact with each of the circuit side terminals 11 in a state that both of the substrates are installed. In order to make such a contact, the locations of the head side terminals 8 and the circuit side terminals 11 and the length of the terminal leads 9 are set. Each of the terminal leads 9 is soldered to each of the circuit side terminals 11.

Figure 10:
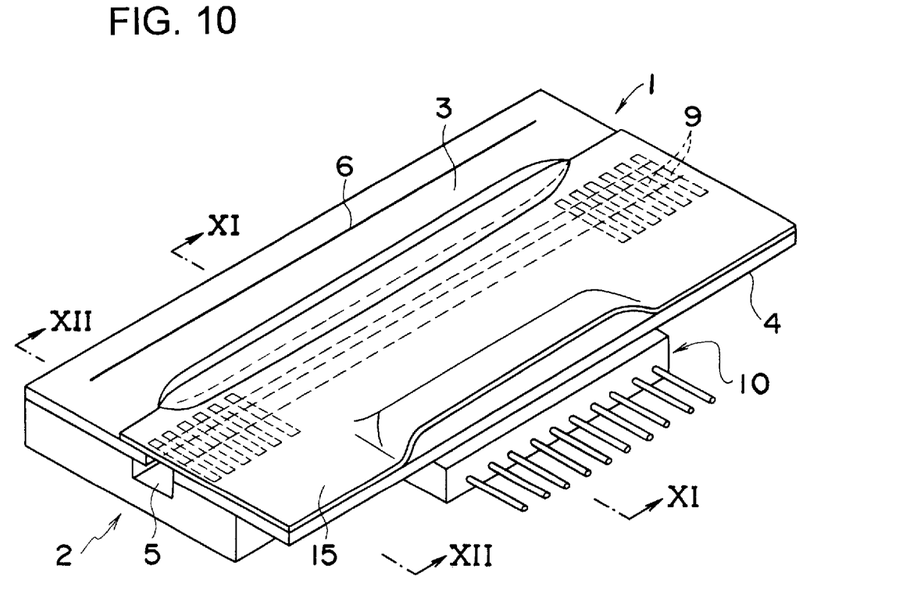
FIG. 10 is a cut-away view illustrating a thermal print head on which a protection sheet provided in according to Embodiment 1 of the present invention.
Figure 11:
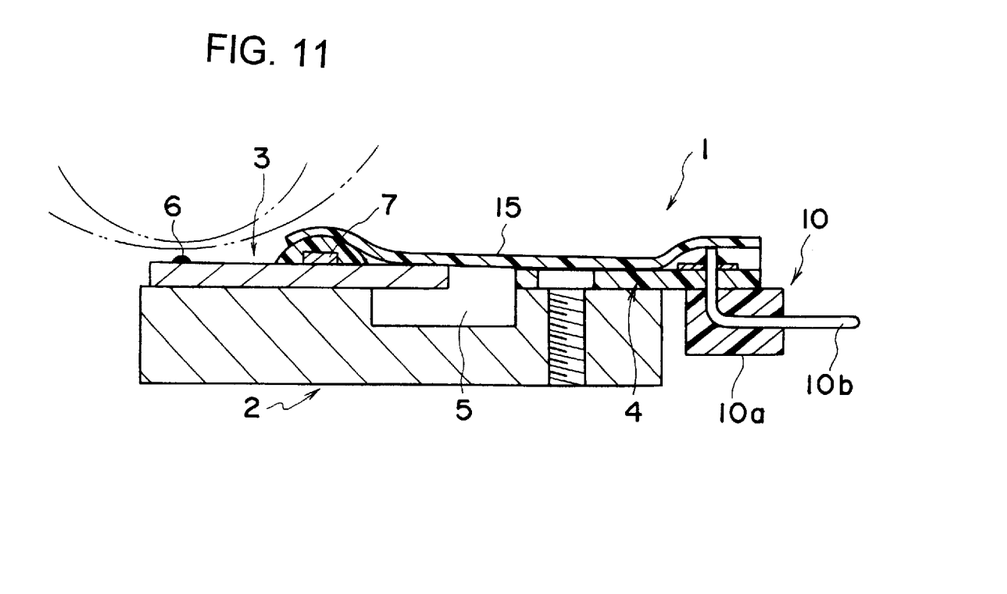
FIG. 11 is an enlarged view of the section XI—XI illustrating the thermal print head of FIG. 10.
Figure 12:
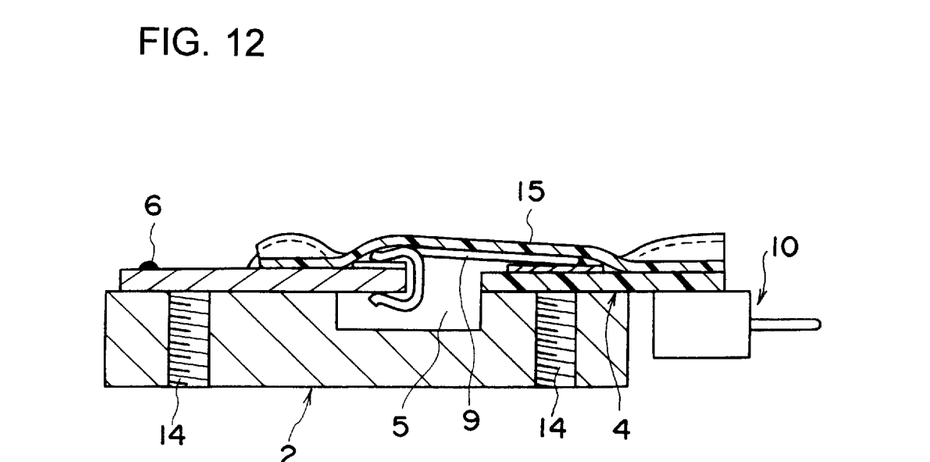
FIG. 12 is an enlarged view of the section XII—XII illustrating the thermal print head of FIG. 10.

As shown in FIGS. 10 to 12, an insulating protection sheet 15 is adhered to the upper surfaces of the head substrate 3 and the circuit substrate 4. The insulating protection sheet 15 is adhered to the upper surfaces excluding an area where the heating resistor 6 is formed as shown in the drawings. The protection sheet 15 entirely covers the upper surface of the circuit substrate 4 and also covers the upper surface of the head substrate 3 up to the area on which the circuit drive elements 7 are installed.

FIG. 7 also shows a constitution in which the thermal print head 1 is fitted to a facsimile machine or a printer. The thermal print head 1 is fitted to a frame member 12 of the facsimile. The heat radiating plate 2 adheres closely to the frame member 12. Four pieces of fitting screws 13 are inserted into holes of the frame member 12 from the lower part. These fitting screws engage with each of respective the tapped holes 14 of the heat radiating plate 2, and then tighten.

Next, a method of assembling the thermal print head 1 of this embodiment will be explained. First, the terminal leads 9 are fitted to the head substrate 3. At this time, the longitudinal side edge 3b is inserted between the upper holding piece 9a and the lower holding pieces 9b of each of the terminal leads 9. The circuit substrate 4 is then stuck on the second installation area of the heat radiating plate 2, and the head substrate 3 is stuck on the second installation area. In this state, the lead sections 9c of the terminal leads 9 are in contact with the circuit side terminals 11 and the portions in contact are soldered. Further, the protection sheet 15 is stuck on the head substrate 3 and the circuit substrate 4. The thermal print head 1 thus assembled is loaded on the frame member 12 of a facsimile machine, and the fitting screws 13 are fastened from under the frame member 12.

When the thermal print head is in operation, an electric current is supplied from the connector 10 of the circuit substrate 4 for the purpose of heat generation by the heating resistor 6. The electric current is supplied to the wiring pattern on the head substrate 3 via the wiring pattern on the circuit substrate 4, the circuit side terminals 11, the terminal leads 9, and the head side terminals 8. A signal for driving the circuit drive elements 7 is input to the head substrate 3 in the same manner. Due to switching operation of the circuit drive elements 7 in reply to the input signal, an electric current flows to each of the printing dots of the heating resistor 6. Thus the printing dots generate heat, to carry out printing.

The thermal print head 1 according to the first embodiment of the present invention is as described above. In a conventional device the head substrate 3 and the circuit substrate 4 are firmly fastened, and there has been such a problem that the head substrate 3 warps due to the differential thermal expansion of the substrates. In the first embodiment of the present invention, warping of the head substrate 3 is prevented as described below. The head side terminals 8 and the circuit side terminals 11 are connected through the terminal leads 9. The terminal leads 9 extend from the longitudinal side edge 3b of the head substrate 3 to the circuit substrate 4. If there is a differential thermal expansion of the head substrate 3 and the circuit substrate 4, the terminal leads 9 will warp horizontally. Therefore, there will be no such case that great force applies between the head substrate 3 and the circuit substrate 4 resulting from the differential thermal expansion. This prevents occurrence of a warp in the head substrate 3.

The side edge 3b of the head substrate 3 projects over the groove 5 of the heat radiating plate 2, and the holding pieces 9a and 9b of the terminal leads 9 hold the head substrate 3 between them. In other words, the constitution is such that when the terminal leads 9 are fitted to the head substrate 3, two sides of the head substrate are used. Therefore, the terminal leads 9 are securely and firmly fitted to the head substrate 3.

By providing the groove 5 on the upper surface of the heat radiating plate 2, the surface area of the heat radiating plate 2 increases. Consequently, heat radiation of the heat radiating plate is accelerated.

The upper surface of the head substrate 3 is almost even with that of the circuit substrate 4. This facilitates sticking work of the protection sheet 15. Due to such simplified constitution, the circuit drive elements 7 and the circuit substrate 4 raise the resistance to static electricity.

It is preferable to use an insulating material having a volume resistivity of $10^4 \sim 10^{10}$ ($\Omega \cdot cm$) as a material for the protection sheet 15. If good conductivity of static electricity is given to the protection sheet 15 through use of such a material, the circuit drive elements 7 and the circuit substrate 4 will further increase static electricity resistance.

In the first embodiment of the present invention, an explanation has been made about a case in which the head substrate 3 projects over the groove 5 of the heat radiating plate. However, it is also preferable to have a constitution in which the circuit substrate projects over the groove 5. Further, it is preferable to have a constitution in which both of the substrates project over the groove 5. In the latter case, the terminal leads 9 may grasp either the head substrate 3 or the circuit substrate 4. Further, it is preferable to have constitution in which the terminal leads 9 grasp both the head substrate 3 and the circuit substrate 4.

In the first embodiment of the present invention, the protection sheet 15 is used for the purpose of protecting the head substrate 3 and the circuit substrate 4. However, it is also possible to use other means in order to protect both of the substrates. If both the substrates are highly resistant to static electricity, the protection sheet will obviously not be required.

(2) Embodiment 2

The thermal print head of a second embodiment of the present invention will next be described with reference to FIGS. 13 to 18. In this embodiment, parts corresponding to those already described in the first embodiment will be given the same reference number and their description will be omitted.

In the first embodiment, the protection sheet 15 is adhered to the head substrate 3 and the circuit substrate 4 so as to protect these substrates from static electricity. However, there may be a case that the protection sheet is not, by itself, sufficient for protecting both the head substrate 3 and the circuit substrate 4. Therefore, in the second embodiment, a cover plate 105 is provided in order to cover both substrates.

Figure 13:
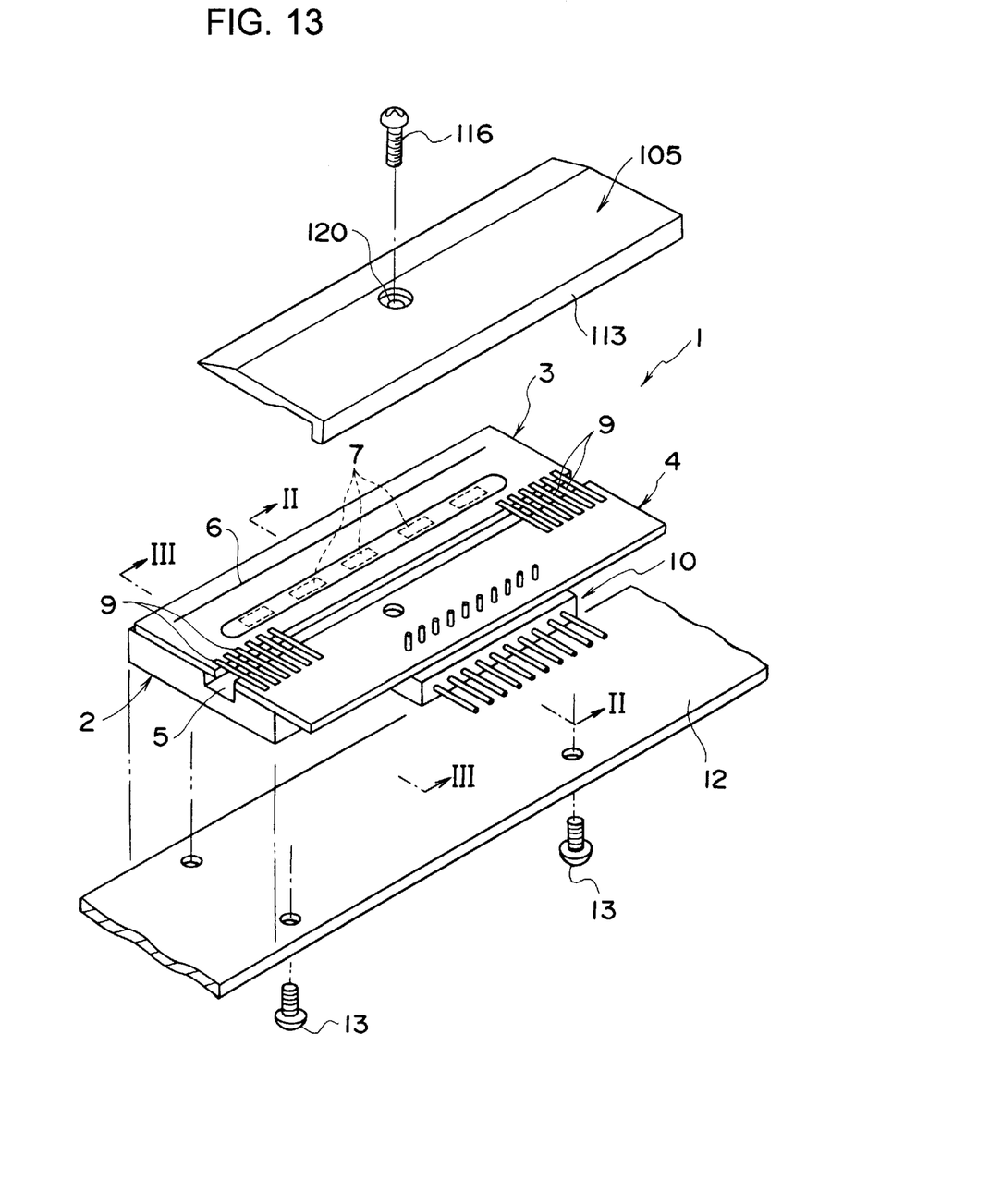
FIG. 13 is a cut-away view illustrating a thermal print head of Embodiment 2 of the present invention in a state of being disassembled.
Figure 14:
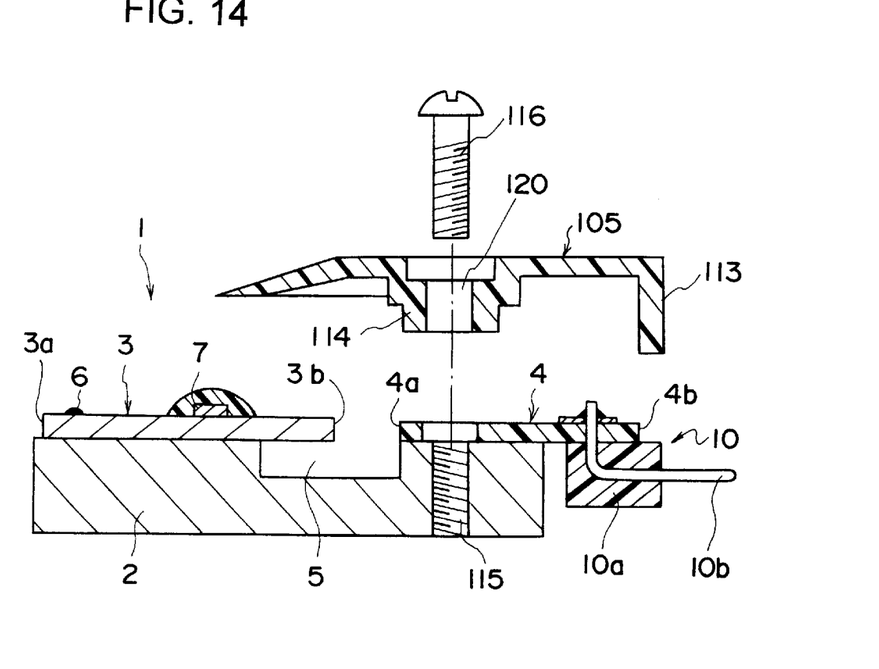
FIG. 14 is an enlarged view of the section II—II illustrating the thermal print head of FIG. 13.
Figure 15:
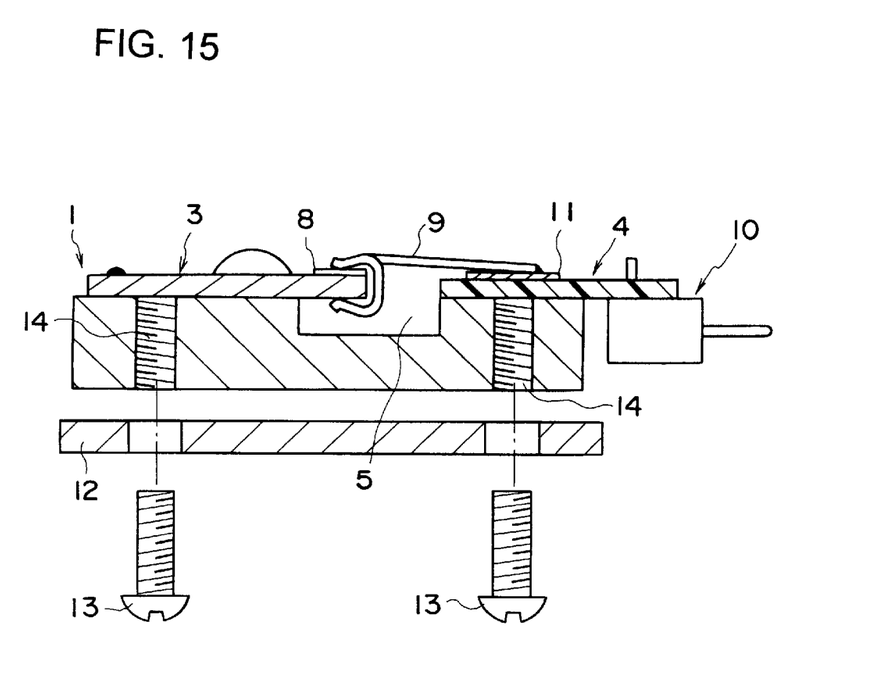
FIG. 15 is an enlarged view of the section III—III illustrating the thermal print head of FIG. 13.
Figure 16:
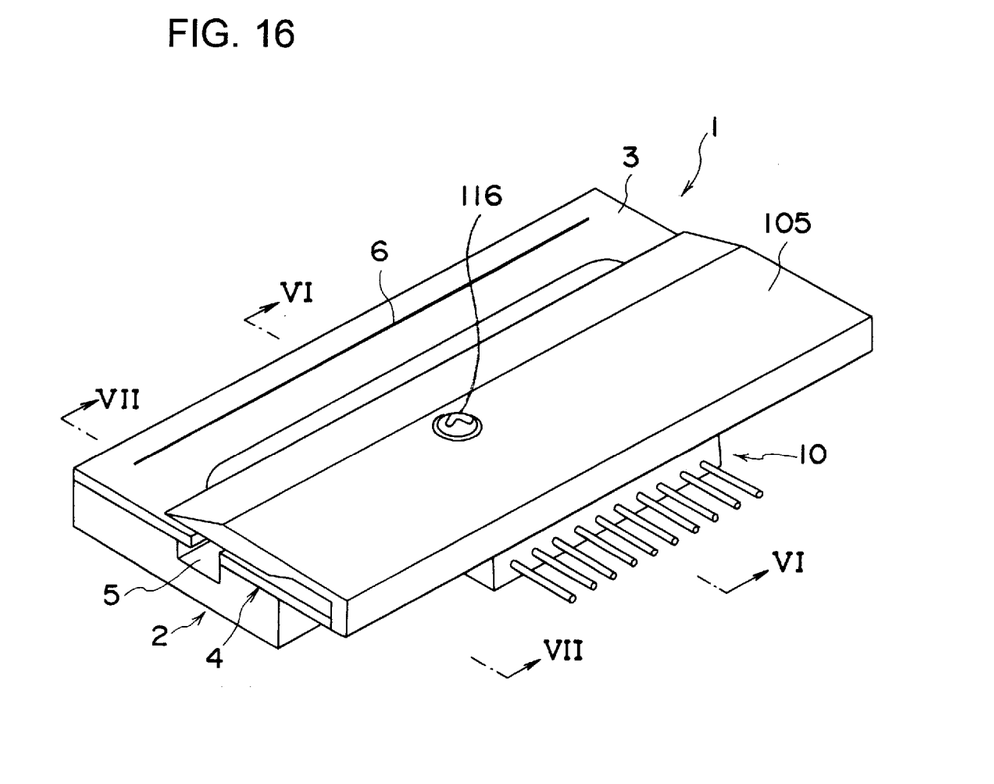
FIG. 16 is a cut-away view illustrating a thermal print head given in Embodiment 2 of the present invention.

In FIG. 13, the cover plate 105 is made of an insulating material, such as a synthetic resin. The cover plate 105 entirely covers the upper surface of the aforementioned circuit substrate 4. It also covers the upper surface of the head substrate 3, up to the area on which the circuit drive elements 7 are installed.

In the center of the lower surface of the cover plate 105, a cylindrical boss, which serves as a contact section 114, projects. When installed, the lower surface of the contact section 114 touches the upper surface of the circuit substrate 4. Therefore, the cover plate 105 is in a position which permits maintaining a distance from the head substrate 3 and the circuit substrate 4. A bolthole 120 is provided in the center of the contact section 114 for the purpose of fitting the cover plate 105 to the heat radiating plate 2.

A rib 113 is provided at an end of the lower surface of the cover plate 105 in a manner that the rib extends along the longitudinal edge 4b of the circuit substrate 4. The rib 113 touches the aforementioned longitudinal edge 4b as well as the upper surface of a connector body 10a.

A method of installing the cover plate 105 will be explained.

By letting the aforementioned rib 113 touch the longitudinal edge 4b of the circuit substrate 4, the cover plate 105 is arranged in a prescribed position. The fitting screw 116 is then inserted into the bolthole 120 of the cover plate 105 from above and engaged with the tapped hole 115 of the heat radiating plate 2. The cover plate 105 is fixed by tightening the fitting screw 116.

In the second embodiment of the present invention, the cover plate 105 has a single function of protecting the head substrate 3 and the circuit substrate 4 by covering both substrates. Unlike the conventional heads, the head substrate 3 and the circuit substrate 4 are electrically connected by the terminal leads 9. In other words, the cover plate 105 does not have a function of electrically connecting both the substrates. Therefore, it is not necessary to strongly connect the cover plate 105 to the heat radiating plate 2. For these reasons, a synthetic resin is used as a material of the cover plate 105. (Currently, an aluminum plates are widely used as a pressing means.) The cover plate 105 is fitted to the heat radiating plate 2 by means of a single fitting screw 116. This fitting screw 116 is not firmly tightened. As the cover plate 105 is not firmly fastened to the heat radiating plate 2, deformation of each part resulting from tightening is prevented. Also, deformation of each part resulting from the differential thermal expansion is prevented. Consequently, quality in printing by using the thermal print head can be improved.

Figure 17:
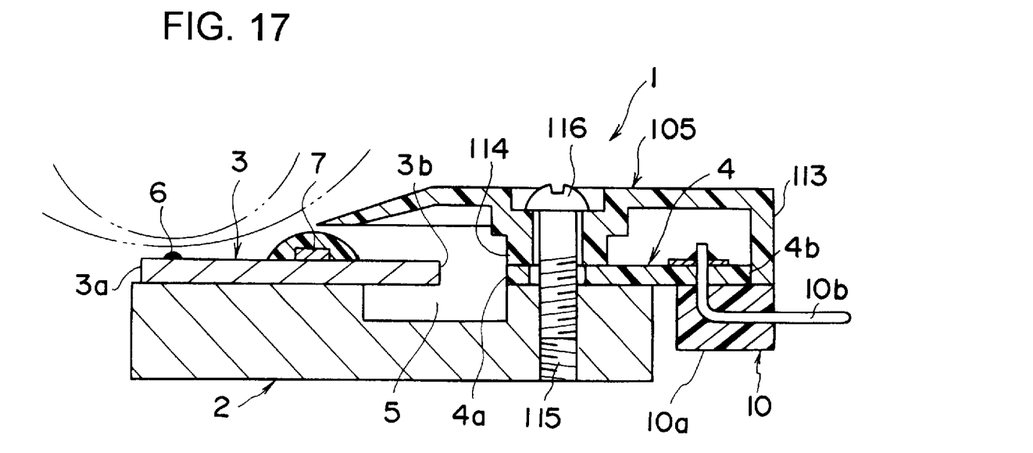
FIG. 17 is an enlarged view of the section VI—VI illustrating the thermal print head of FIG. 16.
Figure 18:
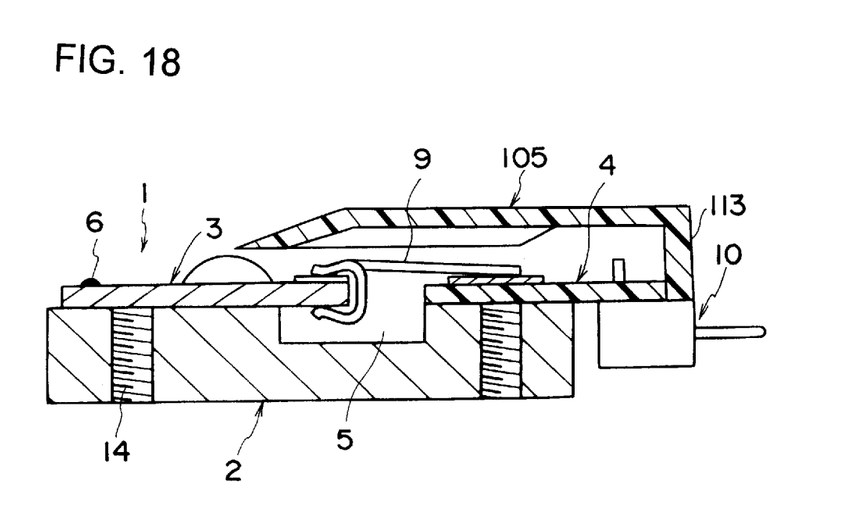
FIG. 18 is an enlarged view of the section VII—VII illustrating the thermal print head of FIG. 16.

As shown in FIG. 17, when the cover plate 105 is installed, the lower surface of the contact section 114 touches the upper surface of the circuit substrate 4 and the rib 113 touches the upper surface of the connector body 11a. The lower surface of the cover plate 105 is arranged a prescribed distance from the head substrate 3 and the circuit substrate 4 without directly touching these substrates. Therefore, the substrates will not be damaged by installation of the cover plate 105.

The rib 113 is installed so that it touches the longitudinal edge 4b of the circuit substrate. By putting the rib 113 to the longitudinal edge 4b at the time of installation of the cover plate 105, the position of the cover plate 105 is determined. This facilitates the installation of the cover plate at a prescribed position.

The thermal print head according to the second embodiment is as described above. In the first embodiment, the protection sheet 15 is used in order to cover the head substrate 3 and the circuit substrate 4. In the second embodiment, however, the cover plate 105 is used. Therefore, a function of protecting each substrate is reinforced. Further, by providing the rib 113 and the contact section 114, the cover plate 105 is constituted in the most suitable manner.

It is preferable to use an insulating material having volume resistivity of $10^4 \sim 10^{10}$ ($\Omega \cdot cm$) as a material of the cover plate 105. If good static electricity conductivity is given to the cover plate 105 through use of such a material, the circuit drive elements 7 and the circuit substrate 4 will further enhance resistance to static electricity.

Industrial Applicability

The present invention is applicable to printers such as found in devices such as facsimile machines or the like. The present invention can be widely applied as a printing head in various types of printers.

What is claimed is:

1. A thermal print head comprising:

a head substrate having a heating resistor for printing and at least one circuit drive element;

a circuit substrate having a connector for external connection and being electrically connected with said head substrate; and wherein said head substrate and said circuit substrate are installed side by side on a heat radiating metallic plate, said heat radiating metallic plate has an installation area parting groove extending in a longitudinal direction on a surface where said substrates are installed, said head substrate and said circuit substrate are arranged on said surface so that they lie on opposite sides of said groove, and a terminal electrode provided at an edge on said groove side of said head substrate and a terminal electrode provided at an edge on said groove side of said circuit substrate are connected to each other by a terminal lead.

2. The thermal print head according to claim 1, wherein at least one projected edge section having upper and lower sides is formed in a manner that at least one of the edges on said groove side of said head substrate and said circuit substrate projects over said groove; said terminal lead has a holding section for holding said projected edge section in between the upper and lower sides thereof; and said terminal lead is fitted to said projected edge section by said holding section.

3. The thermal print head according to claim 2, wherein said terminal lead is made of an elastic metallic material and holds said projected edge section by an elastic property.

4. The thermal print head according to claim 3, wherein an insulating protection sheet is stuck on upper surfaces of said head substrate and said circuit substrate except for at least an area where said heating resistor is provided.

5. The thermal print head according to claim 3, wherein a cover plate is installed in a manner that said cover plate covers both said circuit substrate and an area of said head substrate on which said at least one circuit drive element is provided.

6. The thermal print head according to claim 5, wherein a convexity is provided on a back of said cover plate such that said cover plate can be arranged a prescribed distance from said head substrate and said circuit substrate.

7. A thermal print head comprising:

a head substrate having a heating resistor for printing and a plurality of circuit drive elements;

a circuit substrate having a connector to external devices and being electrically connected with said head substrate; and wherein said head substrate and said circuit substrate are installed on a heat radiating metal plate, said heat radiating metal plate has an installation area parting groove extending in a longitudinal direction on a surface where said substrates are installed, said head substrate and said circuit substrate are arranged on said surface to lie on opposite sides of said groove, and a projected edge section having upper and lower sides is formed in a manner that an edge on said groove side of said head substrate projects over said groove, a terminal electrode provided at the edge on said groove side of said head substrate and a terminal electrode provided at an edge on said groove side of said circuit substrate are connected to each other by a terminal lead, and said terminal lead has a holding section which holds said projected edge section from the upper and lower sides thereof and by which said terminal lead is fitted to said projected edge section.

* * * * *